(12) United States Patent
Luo

(10) Patent No.: US 6,867,974 B2
(45) Date of Patent: Mar. 15, 2005

(54) HEAT-DISSIPATING DEVICE

(76) Inventor: Chin-Kuang Luo, 5F, No. 56, Min-Chuan Rd., Chung Dist., Taichung City (TW)

( * ) Notice: Subject to any disclaimer, the term of this patent is extended or adjusted under 35 U.S.C. 154(b) by 53 days.

(21) Appl. No.: 10/395,916

(22) Filed: Mar. 24, 2003

(65) Prior Publication Data

US 2004/0100771 A1 May 27, 2004

(30) Foreign Application Priority Data

Nov. 25, 2002 (TW) .................................. 91134215 A

(51) Int. Cl.$^7$ .............................................. H05K 7/20
(52) U.S. Cl. ................ 361/700; 165/80.4; 165/104.33; 174/15.2; 257/715; 257/722; 361/703
(58) Field of Search ............................... 165/80.2–80.4, 165/104.26, 104.33; 174/15.2; 257/715–716, 722; 361/700, 703, 699, 715, 687, 694–695, 697

(56) References Cited

U.S. PATENT DOCUMENTS 5,529,115 A * 6/1996 Paterson ................ 165/104.33

FOREIGN PATENT DOCUMENTS

GB 2052164 * 1/1981 .................. 361/690

* cited by examiner

Primary Examiner—Gregory Thompson
(74) Attorney, Agent, or Firm—Trop, Pruner & Hu, P.C.

(57) ABSTRACT

A heat-dissipating device includes a hollow heat-transfer member adapted to be disposed on a heat-generating source and confining a vacuum sealed chamber therein, an amount of coolant medium contained in the vacuum sealed chamber for heat exchange, and a plurality of heat-dissipating fins provided on the heat-transfer member. The vacuum sealed chamber has a wider section, a narrower section, and a neck section between the wider and narrower sections. The neck section hampers movement of the coolant medium from the wider section to the narrower section when the heat-transfer member is tilted from an upright position, where the narrower section is disposed above the wider section.

16 Claims, 5 Drawing Sheets

HEAT-DISSIPATING DEVICE

CROSS-REFERENCE TO RELATED APPLICATION

This application claims priority of Taiwanese Application No. 091134215, filed Nov. 25, 2002.

BACKGROUND OF THE INVENTION

1. Field of the Invention

The invention relates to a heat-dissipating device, more particularly to a heat-dissipating device that is capable of fast heat dissipation.

2. Description of the Related Art

FIG. 1 shows a conventional heat-dissipating device adapted to be mounted on top of a heat-generating component 12 that is disposed on a circuit board 11 of an electronic device. The heat-generating component 12 can be a central processing unit, an integrated circuit, or the like. The heat-dissipating device includes an aluminum heat-dissipating fin unit 13 disposed in thermal contact with the heat-generating component 12, and a fan 14 oriented toward the fin unit 13. The fin unit 13 has a bottom portion provided with a heat-conducting plate 15 that is formed from copper and that facilitates the transfer of heat generated by the heat-generating component 12 to the fin unit 13. However, such a conventional heat-dissipating device has the following setbacks:

1. Although aluminum and copper have quite high temperature coefficients of conductivity, their combined heat-dissipating effect is not very satisfactory, resulting in that the surface temperature of the heat-generating component 12 remains higher than that of the fin unit 13. That is, currents of air blown by the fan 14 can only disperse the heat around the fin unit 13, and cannot reach the surface of the heat-generating component 12 to dissipate the heat of the heat-generating component 12.

2. In view of the aforesaid, when heat gradually accumulates on the surface of the heat-generating component 12, since the conventional heat-dissipating device cannot effectively dissipate the high heat, the operation of the heat-generating component 12 will be affected, which may result in shutdown of or even damage to the electronic device.

SUMMARY OF THE INVENTION

Therefore, the main object of the present invention is to provide a heat-dissipating device that has a vacuum sealed chamber for containing a coolant medium and that is capable of fast heat dissipation.

Accordingly, a heat-dissipating device of the present invention includes:
- a hollow heat-transfer member adapted to be disposed on a heat-generating source and confining a vacuum sealed chamber therein;
- an amount of coolant medium contained in the vacuum sealed chamber for heat exchange; and
- a plurality of heat-dissipating fins provided on the heat-transfer member;
- wherein the vacuum sealed chamber has a wider section, a narrower section, and a neck section between the wider and narrower sections, the neck section hampering movement of the coolant medium from the wider section to the narrower section when the heat-transfer member is tilted from an upright position, where the narrower section is disposed above the wider section.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
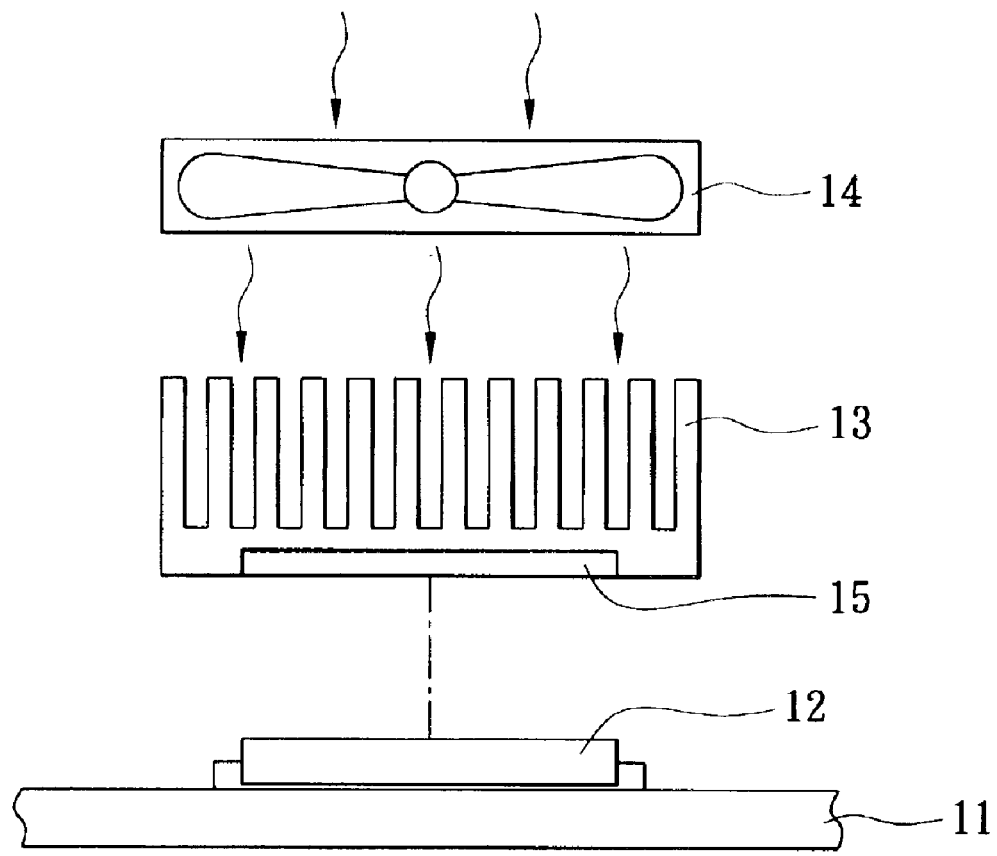
FIG. 1 is an exploded schematic view of a conventional heat-dissipating device.

Before the present invention is described in greater detail, it should be noted that like elements are denoted by the same reference numerals throughout the disclosure.

Figure 2:
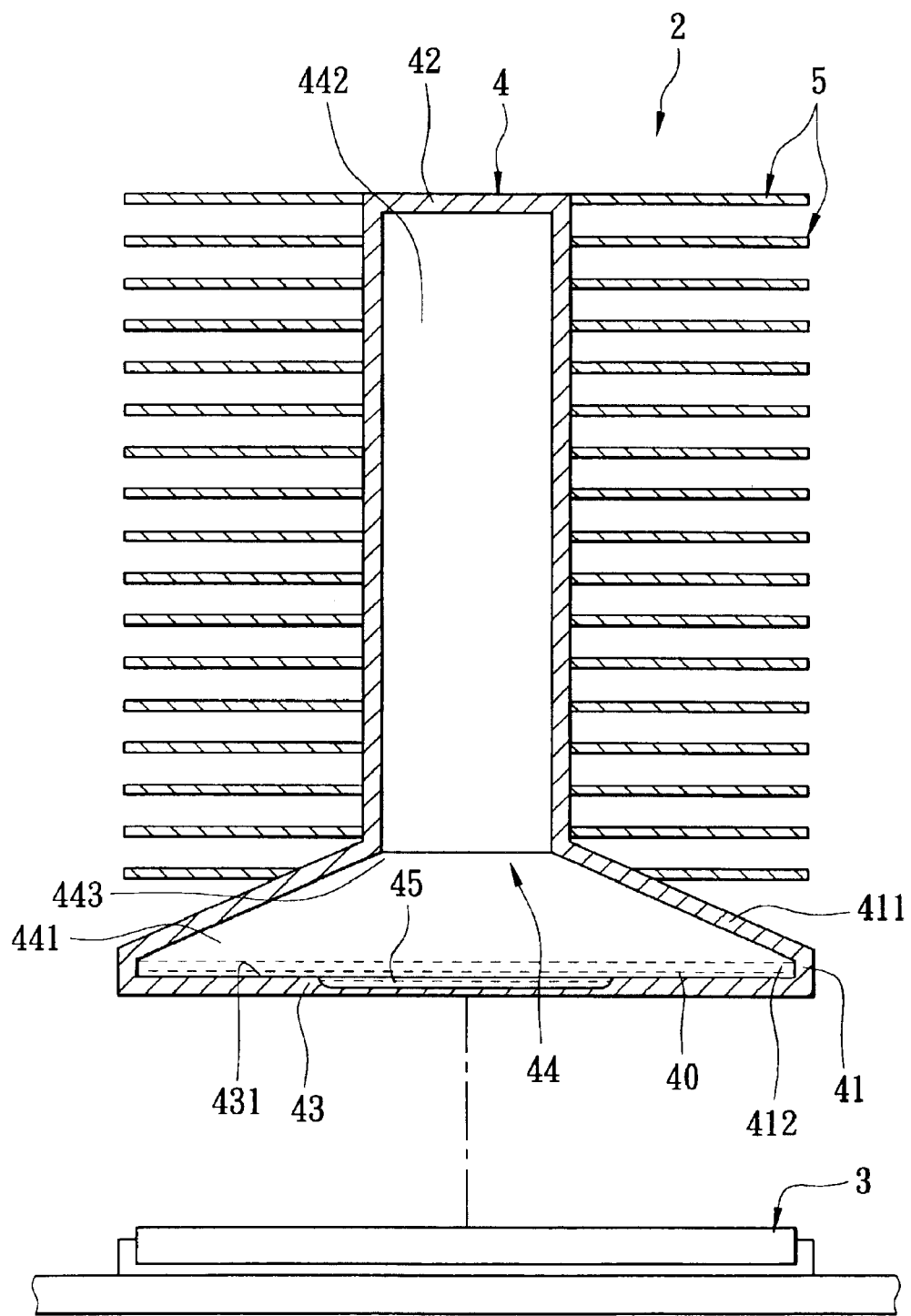
FIG. 2 is an assembled sectional view of the preferred embodiment of a heat-dissipating device according to the present invention, which is adapted for mounting on a heat-generating source and which has a heat-transfer member in an upright position.
Figure 3:
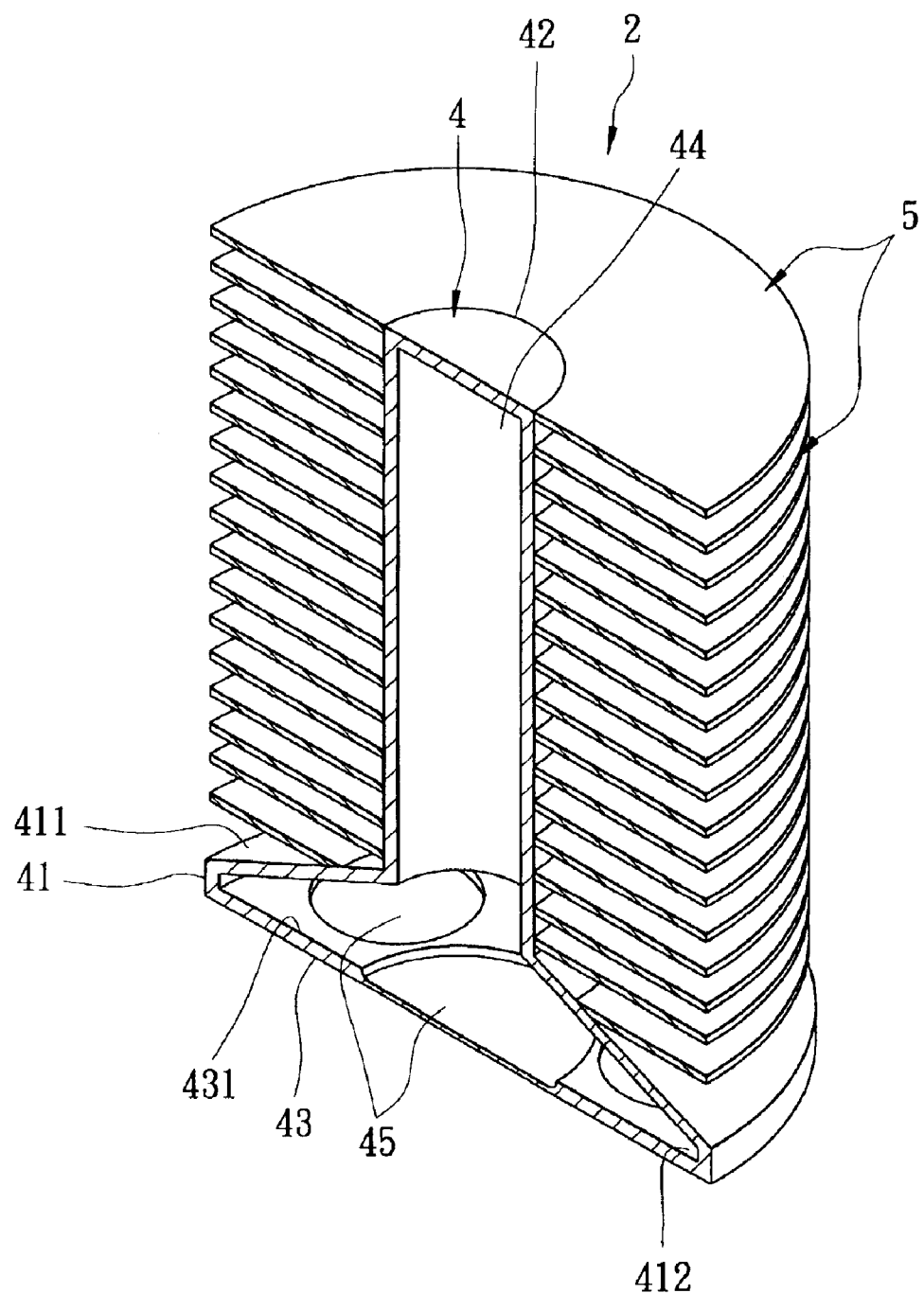
FIG. 3 is an assembled sectional view of the preferred embodiment in part.

Referring to FIGS. 2 and 3, the first preferred embodiment of a heat-dissipating device 2 according to the present invention is shown to be adapted for mounting on a heat-generating source 3, which can be a central processing unit (CPU), an integrated circuit (IC), etc. In this embodiment, the heat-generating source 3 is a central processing unit. As illustrated, the heat-dissipating device 2 includes a hollow heat-transfer member 4 that is adapted to be disposed on the heat-generating source 3 in an upright position for dissipating the heat generated by the latter and that confines a vacuum sealed chamber 44 therein. A suitable amount of coolant medium 40 is contained in the vacuum sealed chamber 44 for heat exchange. A plurality of heat-dissipating fins 5 are provided on the heat-transfer member 4.

The vacuum sealed chamber 44 has a wider section 441, a narrower section 442, and a neck section 443 between the wider and narrower sections 441, 442. The neck section 443 hampers movement of the coolant medium 40 from the wider section 441 to the narrower section 442 when the heat-transfer member 4 is tilted from an upright position, where the narrower section 442 is disposed above the wider section 441.

The heat-transfer member 4 includes a circular base portion 41 adapted to be disposed on the heat-generating source 3, and a post portion 42 that extends from the base portion 41 and that is narrower than the base portion 41. The base portion 41 confines the wider section 441 and the neck section 443 of the vacuum sealed chamber 44. The post portion 42 confines the narrower section 442 of the vacuum sealed chamber 44. In this embodiment, the post portion 42 is cylindrical and has a uniform cross-section.

The base portion 41 has a contacting wall 43 with an outer wall surface that is adapted to be disposed on the heat-generating source 3, and an inner wall surface 431 that confronts the vacuum sealed chamber 44 and that is formed with at least one coolant groove 45 in fluid communication with the vacuum sealed chamber 44. The base portion 41 further has a connecting wall 411 connected to the post portion 42. The connecting wall 411 gradually converges from the contacting wall 43 in a direction toward the post portion 42 such that an inner wall surface of the connecting wall 411 and the inner wall surface 431 of the contacting wall 43 cooperatively confine an annular corner part 412 of the wider section 441.

The heat-dissipating fins 5 are provided on the post portion 42, and include annular fin plates spaced apart from each other along the length of the post portion 42. Preferably, each of the heat-dissipating fins 5 has an outer surface coated with a thermally conductive material.

Preferably, the heat-dissipating fins 5 and the post portion 42 are connected integrally, and the base portion 41 and the post portion 42 are connected integrally.

In the present invention, the coolant medium 40 can be a thermally conductive material, such as water, methanol, acetone, ammonia, nitrogen, sodium, lithium, or mixtures thereof. Alternatively, the coolant medium 40 can be a superconductor material.

In practice, prior to injection of the coolant medium 40 into the vacuum sealed chamber 44, the vacuum sealed chamber 44 is subjected to passivation, washing and drying such that the inner wall surfaces of the post portion 42 and the base portion 41 which confine the vacuum sealed chamber 44 are formed into capillary surfaces to facilitate adhesion of the coolant medium 44 thereto.

Figure 4:
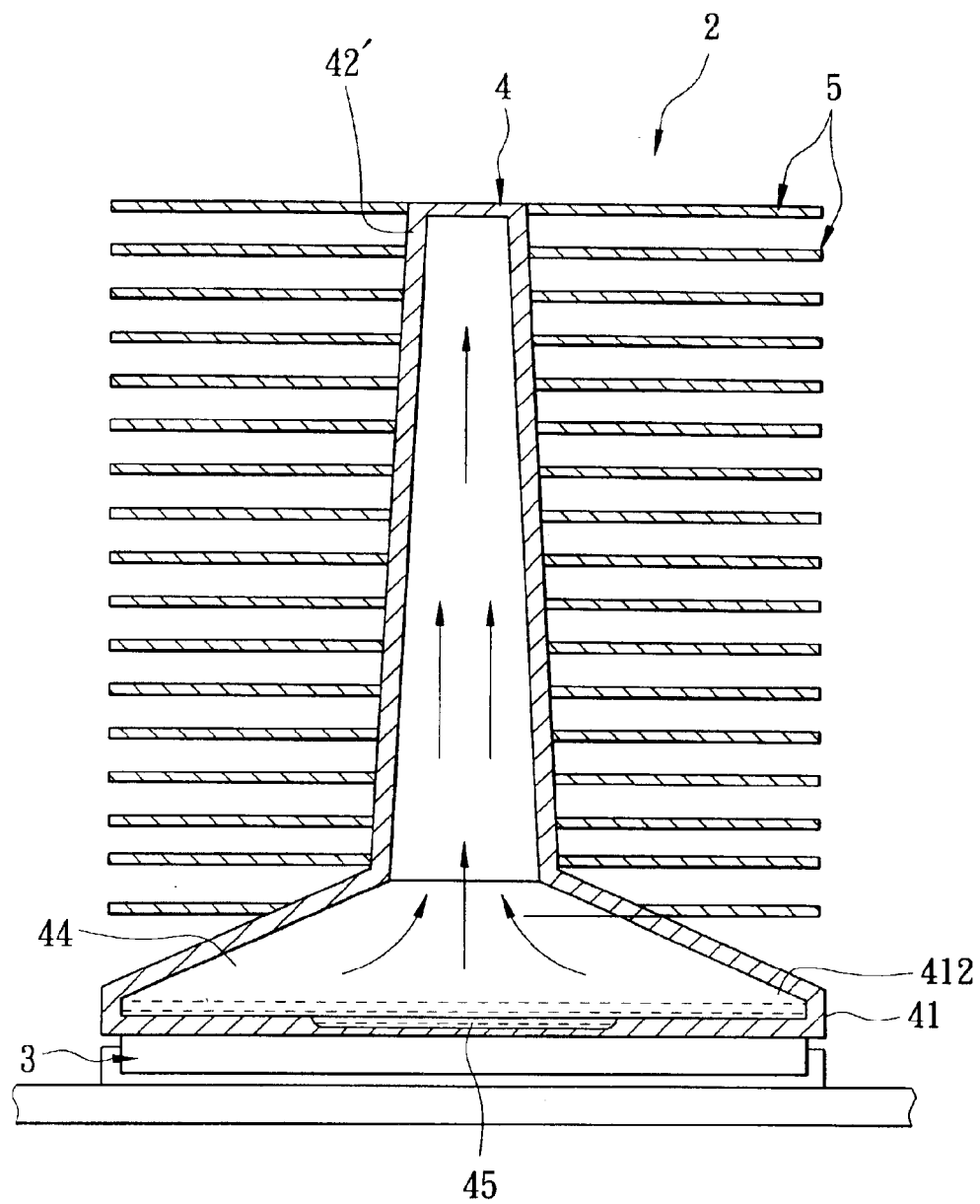
FIG. 4 is an assembled sectional view showing a modification of the preferred embodiment, which is mounted on the heat-generating source and which has the heat-transfer member in the upright position.

FIG. 4 shows a modification of the preferred embodiment. As shown, the heat-transfer member 4 includes a modified post portion 42', which is formed as a truncated cone and which has a cross-section that is gradually reduced in a direction away from the base portion 41.

In use, when the temperature of the heat-generating source 3 rises (e.g., during operation of the central processing unit), due to influence of the low pressure within the vacuum sealed chamber 44 (liquid within a low pressure vacuum space will evaporate at a relatively low temperature), the coolant medium 40 collected in the coolant grooves 45 can be quickly heated by the heat of the heat-generating source 3 to result in phase change thereof and quick distribution of the heat throughout the vacuum sealed chamber 44, thereby distributing the heat generated by the heat-generating source 3 all over the heat-transfer member 4. In other words, the heat produced by the heat-generating source 3 can be largely transferred upward from the base portion 41 through the post portion 42, 42'. Since the heat-dissipating fins 5 cover an extensive area and since the heat-dissipating fins 5 are coated with the thermally conductive material, the heat can be dissipated to the ambient very quickly. It is particularly noted that the post portion 42', which has the form of a truncated cone, can help enhance transfer of heat distributed by the coolant medium 40 to the heat-dissipating fins 5 for heat dissipation.

Figure 5:
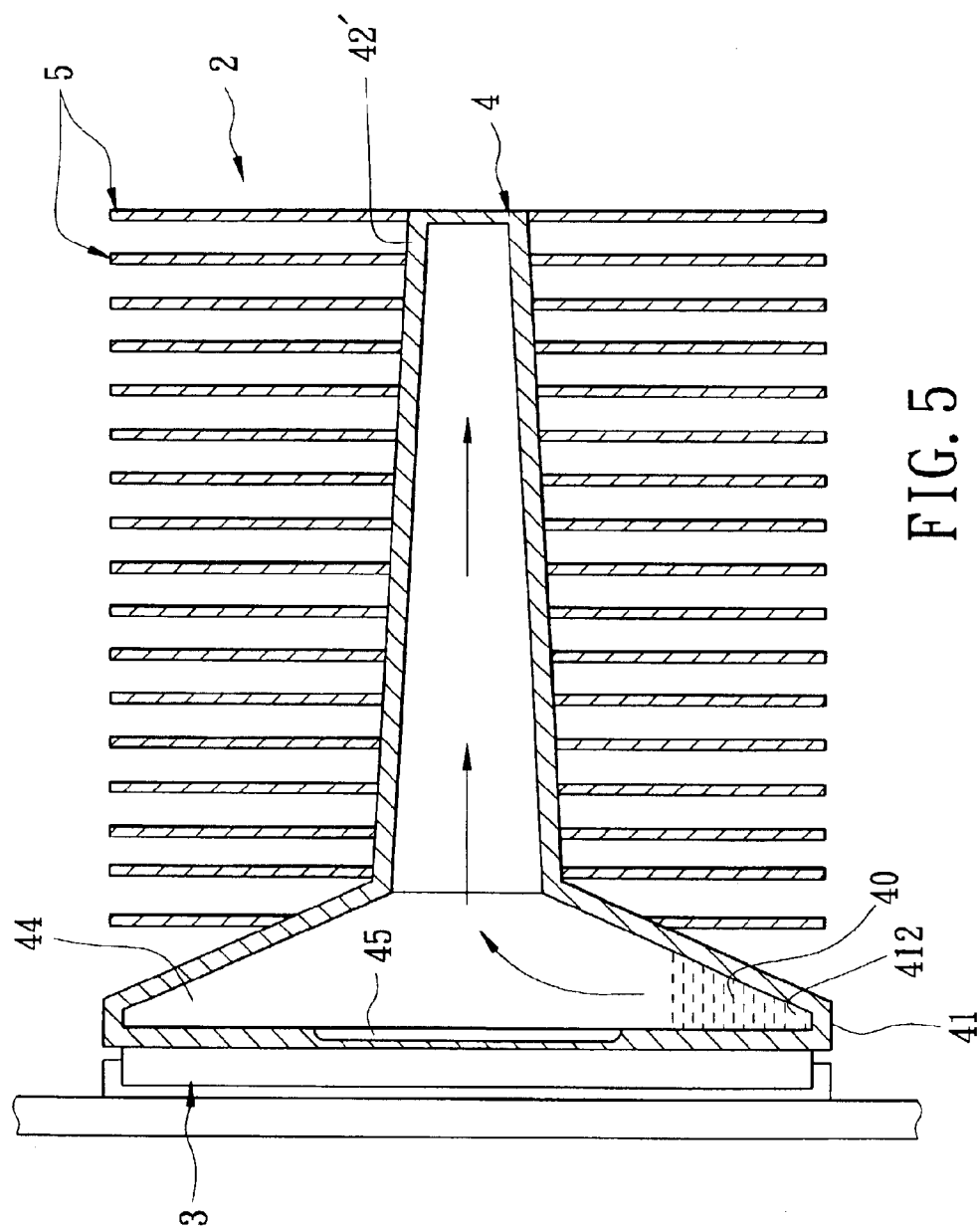
FIG. 5 is a sectional view illustrating that the heat-transfer member of the modified embodiment of FIG. 4 is tilted from the upright position.

It is further noted that due to the arrangement of the coolant grooves 45 and the annular corner part 412, even if the heat-transfer member 4 is tilted from the upright position in use, as shown in FIG. 5, the coolant medium 40 can be collected so as to be excited by the high temperature of the heat-generating source 3 for enhanced heat transfer. As such, the present invention can be arranged in a position as desired, depending on the user's requirement.

In actual practice, the heat-dissipating device 2 can be positioned on the heat-generating source 3 by fastening means (not shown) in a known manner.

In view of the foregoing, the heat-dissipating device 2 of the present invention can quickly and evenly dissipate the heat generated by the heat-generating source 3, and will not incur the aforesaid disadvantages of the prior art.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A heat-dissipating device comprising:
    a hollow heat-transfer member adapted to be disposed on a heat-generating source and confining a vacuum sealed chamber therein;
    an amount of coolant medium contained in said vacuum sealed chamber for heat exchange;
    a plurality of heat-dissipating fins provided on said heat-transfer member;
    wherein said vacuum sealed chamber has a wider section, a narrower section, and a neck section between said wider and narrower sections, and neck section hampering movement of said coolant medium from said wider section to said narrower section when said heat-transfer member is tilted from an upright position, where said narrower section is disposed above said wider section;
    wherein said heat transfer member includes a base portion adapted to be disposed on the heat-generating source, and a post portion that extends from said base portion, said base portion confining said wider section and said neck section of said vacuum sealed chamber, said post portion confining said narrower section of said vacuum sealed chamber; and
    wherein said base portion has a contacting wall with an outer wall surface that is adapted to be disposed on the heat-generating source, and an inner wall surface that confronts said vacuum sealed chamber and that is formed with a coolant groove in fluid communication with said vacuum sealed chamber.

2. The heat-dissipating device as claimed in claim 1, wherein said post portion is narrower than said base portion.

3. The heat-dissipating device as claimed in claim 2, wherein said base portion has a connecting wall connected to said post portion, said connecting wall gradually converging in a direction toward said post portion.

4. The heat-dissipating device as claimed in claim 2, wherein said post portion has a uniform cross-section.

5. The heat-dissipating device as claimed in claim 2, wherein said post portion has a cross-section that is gradually reduced in a direction away from said base portion.

6. The heat-dissipating device as claimed in claim 1, wherein said heat-dissipating fins are provided on said post portion.

7. The heat-dissipating device as claimed in claim 6, wherein said heat-dissipating fins include annular fin plates spaced apart from each other along the length of said post portion.

8. The heat dissipating device as claimed in claim 7, wherein each of said heat-dissipating fins is coated with a thermally conductive material.

9. The heat-dissipating device as claimed in claim 6, wherein said heat-dissipating fins and said post portion are connected integrally.

10. The heat-dissipating device as claimed in claim 1, wherein said base portion and said post portion are connected integrally.

11. The heat-dissipating device as claimed in claim 1, wherein said heat-transfer member and said heat-dissipating fins are connected integrally.

12. The heat-dissipating device as claimed in claim 1, wherein each of said heat-dissipating fins is coated with thermally conductive material.

13. A heat-dissipating device comprising:
a hollow heat-transfer member adapted to be disposed on a heat-generating source and confining a vacuum sealed chamber therein;
an amount of coolant medium contained in said vacuum sealed chamber for heat exchange;
a plurality of heat-dissipating fins provided on said heat-transfer member,
wherein said vacuum sealed chamber has a wider section, a narrower section, and a neck section between said wider and narrower sections, and neck section hampering movement of said coolant medium from said wider section to said narrower section when said heat-transfer member is tilted from an upright position, where said narrower section is disposed above said wider section;
wherein said heat transfer member includes a base portion adapted to be disposed on the heat-generating source, and a post portion that extends from said base portion, said base portion confining said wider section and said neck section of said vacuum sealed chamber, said post portion confining said narrower section of said vacuum sealed chamber;
wherein said post portion is narrower than said base portion; and
wherein said base portion has a connecting wall connected to said post portion, said connecting wall gradually converging in a direction toward said post portion.

14. A heat-dissipating device comprising:
a hollow heat-transfer member adapted to be disposed on a heat-generating source and confining a vacuum sealed chamber therein;
an amount of coolant medium contained in said vacuum sealed chamber for heat exchange;
a plurality of heat-dissipating fins provided on said heat-transfer member;
wherein said vacuum sealed chamber has a wider section, a narrower section, and a neck section between said wider and narrower sections, and neck section hampering movement of said coolant medium from said wider section to said narrower section when said heat-transfer member is tilted from an upright position, where said narrower section is disposed above said wider section;
wherein said heat transfer member includes a base portion adapted to be disposed on the heat-generating source, and a post portion that extends from said base portion, said base portion confining said wider section and said neck section of said vacuum sealed chamber, said post portion confining said narrower section of said vacuum sealed chamber;
wherein said post portion is narrower than said base portion; and
wherein said post portion has a cross-section that is gradually reduced in a direction away from said base portion.

15. A heat-dissipating device comprising:
a hollow heat-transfer member adapted to be disposed on a heat-generating source and confining a vacuum sealed chamber therein;
an amount of coolant medium contained in said vacuum sealed chamber for heat exchange;
a plurality of heat-dissipating fins provided on said heat-transfer member;
wherein said vacuum sealed chamber has a wider section, a narrower section, and a neck section between said wider and narrower sections, and neck section hampering movement of said coolant medium from said wider section to said narrower section when said heat-transfer member is tilted from an upright position, where said narrower section is disposed above said wider section;
wherein said heat transfer member includes a base portion adapted to be disposed on the heat-generating source, and a post portion that extends from said base portion, said base portion confining said wider section and said neck section of said vacuum sealed chamber, said post portion confining said narrower section of said vacuum sealed chamber;
wherein said heat-dissipating fins are provided on said post portion; and
wherein said heat-dissipating fins include annular fin plates spaced apart from each other along the length of said post portion.

16. The heat dissipating device as claimed in claim 15, wherein each of said heat-dissipating fins is coated with a thermally conductive material.

* * * * *